US011269002B2

(12) United States Patent
Forssén et al.

(10) Patent No.: US 11,269,002 B2
(45) Date of Patent: Mar. 8, 2022

(54) HIGH-VOLTAGE LEAD-THROUGH DEVICE AND ARRANGEMENT FOR HANDLING DATA OF A HIGH-VOLTAGE LEAD-THROUGH DEVICE (71) Applicant: Hitachi Energy Switzerland AG, Baden (CH)

(72) Inventors: Cecilia Forssén, Västerås (SE); Joachim Schiessling, Enköping (SE); Peter Sjöberg, Ludvika (SE); Andrew Maxwell, Västerås (SE)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/294,089

(22) PCT Filed: Nov. 15, 2019

(86) PCT No.: PCT/EP2019/081429
§ 371 (c)(1),
(2) Date: May 14, 2021

(87) PCT Pub. No.: WO2020/099615
PCT Pub. Date: May 22, 2020

(65) Prior Publication Data
US 2021/0356509 A1    Nov. 18, 2021

(30) Foreign Application Priority Data
Nov. 15, 2018  (EP) .................................. 18206505

(51) Int. Cl.
*H01H 31/12*      (2006.01)
*G01R 31/12*      (2020.01)
(Continued)

(52) U.S. Cl.
CPC ..... *G01R 31/1227* (2013.01); *G01R 31/1209* (2013.01); *H01B 17/26* (2013.01); *H01F 27/04* (2013.01)

(58) Field of Classification Search
CPC ............ G01R 31/1227; G01R 31/1209; G01R 31/1272; G01R 31/1254; G01R 31/14;
(Continued)

(56) References Cited

U.S. PATENT DOCUMENTS 3,716,652 A    2/1973  Lusk et al.
4,277,746 A  * 7/1981  Abe ....................... H01H 33/26
                                                            174/11 R
(Continued)

FOREIGN PATENT DOCUMENTS

CN    201466652 U    5/2010
CN    102522161 A    6/2012
(Continued)

OTHER PUBLICATIONS

International Search Report and Written Opinion of the International Searching Authority, PCT/EP2019/081429, dated Jan. 24, 2020, 11 pages.
(Continued)

*Primary Examiner* — Thang X Le
(74) *Attorney, Agent, or Firm* — Sage Patent Group (57) ABSTRACT A high-voltage lead-through device includes an insulator body having a solid exterior and including insulation, a main conductor passing therethrough, a sensor adjacent the main conductor inside the insulator body measuring a physical property of the device and a communication unit adjacent the main conductor outside the insulator body, wherein the main conductor has a first electric potential, a section of the solid exterior of the insulator body faces a second electric potential, the communication unit is connected to the sensor using a signal conductor as a first electrical communication medium and the communication unit employs a different communication medium for communicating with a data distribution device at a third electric potential.

15 Claims, 2 Drawing Sheets (51) Int. Cl.
*H01B 17/26* (2006.01)
*H01F 27/04* (2006.01)

(58) Field of Classification Search
CPC ........ G01R 31/16; G01R 15/08; G01R 15/12; G01R 15/142; G01R 15/144; G01R 15/146; G01R 19/155
See application file for complete search history.

(56) References Cited

U.S. PATENT DOCUMENTS

| | | | |
|---|---|---|---|
| 6,079,875 A | | 6/2000 | Klass et al. |
| 11,146,053 B2* | | 10/2021 | Dhlamini ................. H01F 27/04 |
| 2013/0093410 A1 | | 4/2013 | Eriksson et al. |
| 2014/0021965 A1* | | 1/2014 | De Rybel ............... G01R 15/06 |
| | | | 324/632 |
| 2017/0315000 A1 | | 11/2017 | Wen et al. |
| 2019/0094081 A1 | | 3/2019 | Adams et al. |
| 2021/0311131 A1* | | 10/2021 | Gundel .................. G01R 31/66 |

FOREIGN PATENT DOCUMENTS

| | | |
|---|---|---|
| CN | 204375474 U | 6/2015 |
| CN | 106872792 A | 6/2017 |
| CN | 207353010 U | 5/2018 |
| JP | H04296409 A | 10/1992 |
| JP | H08339920 A | 12/1996 |
| JP | 2009053025 A | 3/2009 |
| WO | 2017152985 A1 | 9/2017 |

OTHER PUBLICATIONS

Extended European Search Report dated May 6, 2019 for European Patent Application No. 18206505.2, 10 pages.

* cited by examiner

HIGH-VOLTAGE LEAD-THROUGH DEVICE AND ARRANGEMENT FOR HANDLING DATA OF A HIGH-VOLTAGE LEAD-THROUGH DEVICE

CROSS REFERENCE TO RELATED APPLICATIONS

This application is a 35 U.S.C. § 371 national stage application of PCT International Application No. PCT/EP2019/081429 filed on Nov. 15, 2019, which in turn claims foreign priority to European Patent Application No. 18206505.2, filed on Nov. 15, 2018, the disclosures and content of which are incorporated by reference herein in their entirety.

FIELD OF INVENTION

The present invention relates to a high-voltage lead-through device as well as to an arrangement for handling data of a high-voltage lead-through device, where the arrangement comprises a data distributing device, a data handling device and a high voltage lead-through device.

BACKGROUND

Lead-through devices, such as bushings, cable terminations and instrument transformers, are used for leading a high voltage conductor through a medium which has a different electric potential than the high voltage conductor. Lead-through devices may be used in high-voltage power applications such as power transmission systems.

It is at times of importance to measure physical properties of such high-voltage lead-through devices, such as temperature. The physical properties may need to be measured for a number of different reasons, where one is in order to determine the ageing of the high-voltage lead-through device.

It is therefore of interest to place a sensor in such a high-voltage lead-through device having an insulator body in order to measure such physical properties.

However, in order to perform measurements in service conditions, i.e. in operation of the device, the location of the sensor must not interfere with the electric field design of the insulator body. The sensor must not jeopardize the function of the high-voltage lead-through device. The sensor may also need to be reliable and function for the whole lifetime of the device without need for service since it will be inside the insulator body.

This has led to optical communication solutions being used.

It is for instance known to use optical fibres as sensors in bushings and connect these to communication units outside of the bushing, where the communication unit is typically placed close to a flange with low potential. One example of this can be seen in WO 2017/152985.

However, optical solutions are often hard to implement practically. It is practically difficult to place an optical fibre in the insulator body of a bushing, especially if the body comprises solid insulation. This is due to the fact that a fibre and the insulator body material react differently to the application of heat in the production process. The fibre is also sensitive to cuts and excessive bending.

It may therefore be of interest to use electric signals instead. However, then the strong electric fields and high electric potential levels do become a problem.

The invention is therefore directed towards implementing sensor measurements using electric signals in such a high voltage level environment that at the same time addresses at least some of the above-mentioned problems.

SUMMARY OF THE INVENTION

One object of the present invention is to provide a high-voltage lead-through device that implements sensor measurements using electric signals while avoiding jeopardizing the function of the high-voltage lead-through device.

This object is according to a first aspect obtained through a high-voltage lead-through device comprising an insulator body having a solid exterior and including insulation, a main conductor passing through the insulator body surrounded by insulation, wherein the insulator body comprises a number of conducting foils around the main conductor, where a closest neighbouring foil is electrically connected to the main conductor, wherein in operation of the high voltage lead-through device the main conductor is configured to have a first electric potential and at least a part of one section of the solid exterior of the insulator body is configured to face a second electric potential by passing through a plane, a ring or a coil having the second potential, a sensor adjacent the main conductor in the interior of the insulator body inside the closest neighbouring foil and configured to measure a physical property of the high voltage lead-through device, and a communication unit adjacent the main conductor outside of the insulator body and being connected to the sensor using a first communication medium, wherein the communication unit comprises a communication module employing a second, different communication medium for communicating data concerning the measured physical property to a data distributing device at a third electric potential and the first communication medium is an electrical communication medium in the form of a signal conductor separated from and stretching along at least a part of the main conductor.

The object is according to a second aspect achieved through an arrangement for handling data of a high voltage lead-through device that is a part of an electric system, where the arrangement comprises a data handling device, a data distributing device and the high voltage lead-through device according to the first aspect, wherein the data handling device is configured receive and handle the measured physical quantity.

The communication unit, sensor and main conductor may have electric potentials that differ from each other by less than 50 V, with advantage less than 10 V and preferably less than 5 V.

The first electric potential of the main conductor may be more than 1 kV above both the second and third electric potentials.

The physical properties may be obtained at the electric potentials used in operation of the high-voltage lead-through device. They may thus be obtained when the high-voltage lead-through device is in operation. When the insulator body comprises foils, it is possible that the sensor is located between a longitudinal axis defined through the centre of the main conductor and the closest neighbouring foil. The main conductor may also be a conductor pipe. In case the conductor is realized as a pipe, it is possible that the sensor is placed inside the conductor pipe. It may additionally be in thermal contact with the pipe. Alternatively, the sensor may be connected between the main conductor and the closest neighbouring foil. The latter placement is possible for any realization of the main conductor, such as pipe, bar or litz realizations.

The signal conductor may be separated from the innermost foil and the main conductor.

The third potential and the second potential may be the same, for instance a ground potential.

The second communication medium may be a wireless communication medium and the communication module may be a wireless communication module. The wireless communication medium may more particularly be a wireless short-range communication medium, such as Bluetooth or Adaptive Network Technology (ANT). The communication module may furthermore be a low power communication unit, such as a Bluetooth Low Energy (BLE) or ANT+ communication module.

The sensor may be a sensor being responsive to a voltage applied to the signal conductor by the communication unit. It does therefore not need any separate power supply.

The sensor may additionally be a temperature sensor such as a PT100 sensor or a thermocouple sensing the physical property of temperature. Alternatively, the sensor may be a microphone sensing the physical property of sound pressure level. A temperature sensor may be a resistive sensor. Also other types of sensors than resistive sensors may be used, such as inductive or capacitive sensors. The sensor may additionally be a top oil level sensor, top oil gas content sensor or a moisture sensor.

The high-voltage lead-through device may be a transformer bushing, a wall bushing, a cable termination or an instrument transformer.

The data handling device may comprise an overload function that handles the physical quantity of temperature. This overload determining function may be implemented in a data handling module of the data handling device. Thereby the data handling device and more particularly the data handling module of the data handling device may be configured to calculate a dynamic thermal rating which can be used in control and protection of the electric power system. The dynamic thermal rating may more particularly be used to set maximum allowable current levels to be used in the electrical power system. The maximum allowable current levels may be set for equipment such a converters and transformers may additionally be dynamically set for use in control and protection.

The data handling device may additionally or instead comprise an ageing determining function. This ageing determining function may be implemented in the data handling module of the data handling device. Thereby the data handling device and more particularly the data handling module of the data handling device may be configured to determine the ageing of the high-voltage lead-through device based on the detected physical property.

The present invention has a number of advantages. A physical property can be measured and used when the high-voltage lead-through device is in operation. The physical property is also measured inside the highly stressed insulation of the insulator body. The placement of the sensor does not interfere with the electric field design of the insulator body. Neither does the sensor jeopardize the function of the high-voltage lead-through device. Through the placement of the communication unit outside the insulator body core furthermore service, repair and replacement is also simplified.

BRIEF DESCRIPTION OF THE DRAWINGS

The present invention will in the following be described with reference being made to the accompanying drawings, where FIG. 1 schematically shows a high-voltage lead-through device electrically connected to a piece of high voltage equipment and wirelessly connected to a data distributing device, FIG. 2 schematically shows a first embodiment of a first type of a high-voltage lead-through device comprising a sensor and a communication unit, FIG. 3 schematically shows a second embodiment of the first type of high-voltage lead-through device comprising the sensor and the communication unit, and FIG. 4 schematically shows the communication unit electrically connected to the sensor and wirelessly connected to the data distributing device as well as a data handling device connected to the data distributing device.

DETAILED DESCRIPTION OF THE INVENTION

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention.

The present invention concerns a high-voltage lead-through device comprising an insulator body with insulation and a main conductor at a high voltage passing through the insulator body of the high-voltage lead-through device. A high-voltage lead-through device may be a bushing like a wall bushing or a transformer bushing. The high voltage lead-through device may also be an instrument transformer or a cable termination.

The invention also concerns an arrangement for handling data of such a high voltage lead-through device, which arrangement comprises the high-voltage lead-through device, a data distributing device and a data handling device.

As was discussed above, a high-voltage lead-through device may be a bushing. The invention will in the following be described in relation to a first type of high-voltage lead-through device in the form of a transformer bushing comprising a condenser core, i.e. a bushing with a main conductor surrounded by insulation and conducting foils.

A bushing is a type of high voltage lead-through device that leads a high voltage conductor through a medium which has a different electric potential than the high voltage conductor.

A bushing may additionally be connected to high-voltage equipment. Examples of equipment include conductors, power lines, inductively operating elements such as reactors and transformers and capacitive elements such as capacitors and capacitive voltage dividers.

Figure 1:
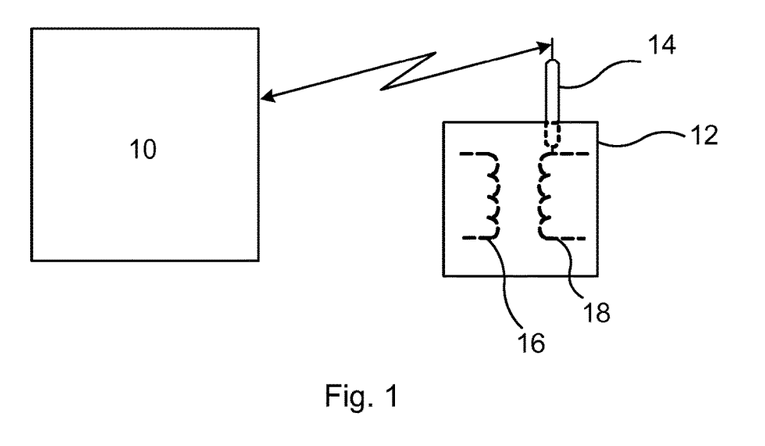

FIG. 1 schematically shows a data distributing device to communicating wirelessly with a bushing 14. The data distributing device to and bushing 14 may be parts of a data handling arrangement, i.e. an arrangement for handling data of the bushing. As will be seen later, such an arrangement may also comprise a data handling device. The bushing 14 is also attached to a piece of electrical high-voltage equipment. In the example depicted in FIG. 1, the piece of equipment is a transformer 12 provided in a transformer tank filled with an insulating fluid, in the form of transformer oil. This transformer 12 has a first and a second winding 16 and 18. The bushing 14 is attached to the transformer 12 and as an example to the second winding 18 of the transformer 12. It should here be realized that it may as an alternative be connected to the first winding instead. One of the windings may form a primary winding, while the other may form a secondary winding.

Figure 2:
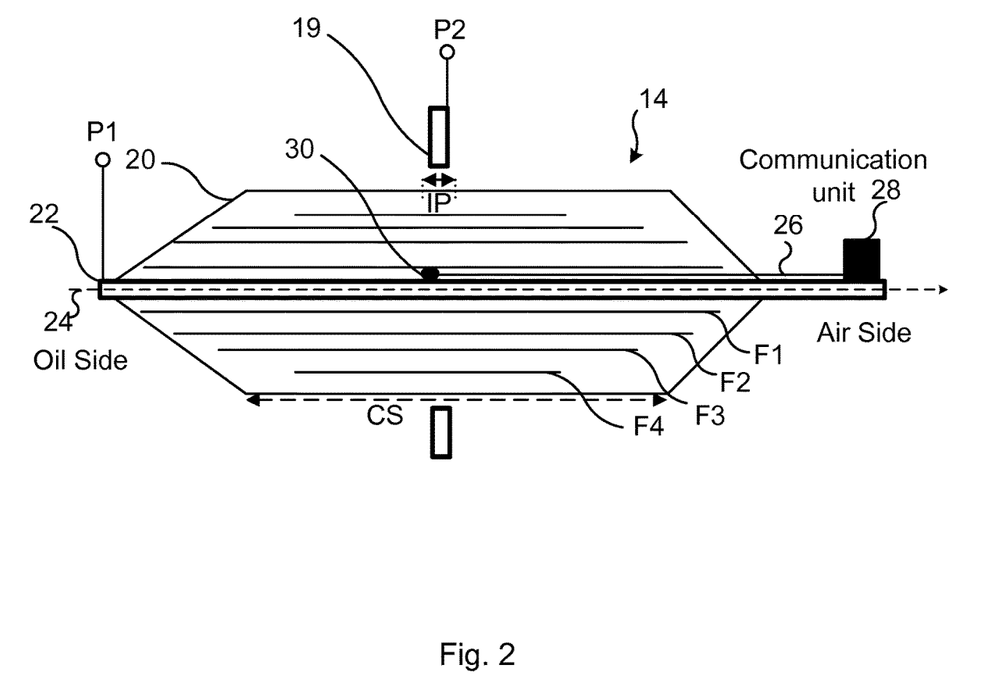

FIG. 2 schematically shows a first embodiment of the first type of high voltage lead-through device, which is thus a transformer bushing.

The bushing 14 according to the first type is a bushing comprising a condenser core, i.e. a bushing comprising conducting foils embedded in insulation. Therefore, the bushing 14 comprises an insulator body 20 in the form of a condenser core. At least the exterior of the core may be solid and in this embodiment the whole condenser core is solid. The condenser core may additionally surround a main conductor 22. The main conductor 22 thus passes through the insulator body. The main conductor 22 thereby passes through the insulator body surrounded by insulation of the insulator body. The main conductor 22 may more particularly be realized as a conductor pipe enclosed in the insulator body 20.

The bushing thus comprises an insulator body 20 in the form of a condenser core comprising insulation surrounding a main conductor 22, which main conductor 22 will have a first electric potential P1 when the bushing is in operation. The bushing 14 has a first end, here termed an oil side end, where the main conductor 22 is connected to the transformer. This end is termed an oil side end because it is supposed to be placed in the transformer housing and immersed in transformer oil. The bushing 14 also comprises an opposite air-side end, which is to project out of the transformer housing and be surrounded by air for connection to other pieces of high voltage equipment. This second end also provides an output of the bushing 14, which is an end via which the conductor 22 leaves or exits the bushing 14 for connection to other high-voltage equipment. The second end is thereby also an output terminal of the bushing. The bushing also typically comprises at least one section that in operation is to interface a medium which has a second electric potential P2 that is different than the first electric potential P1 of the high voltage conductor. This section is in the example of FIG. 2 a central section CS of the condenser core that is to pass through the wall 19 of the transformer tank. It can thereby be seen that the bushing, and then at least a part, which in this case is an interface part IP, of the central section CS of the bushing, passes through a plane having the second potential P2. The second medium is in this case thus the transformer tank wall 19. Thereby it can also be seen that at least a part, in this case the interfacing part IP, of the central section CS of the solid exterior of the condenser core faces the second electric potential P2. The interfacing part IP is a part of the central section CS that faces the element with the second potential P2.

The condenser core 20 typically comprises insulation made of insulating sheets and between these sheets foils of electrically conducting material, such as metal, are provided for voltage control or field grading purposes. These foils and insulation encircle the main conductor 22. The insulating sheets may be cellulose or synthetic, such as thermoplastic. The condenser core may further be solidified using a resin, such as an epoxy resin. However, it is also possible to use oil impregnated paper, OIP.

As was mentioned above, the main conductor 22 has a first electric potential P1, which may be in the kV range. This potential may more particularly be at least 1 kV higher than the second potential P2, which in many cases is ground potential. As the main conductor 22 stretches to the second end of the bushing, this second end will have the same high electric potential as the main conductor 22. Moreover, as the main conductor 22 has a high potential it is also surrounded by a strong electric field. This electric field may be graded by the insulator body 20. The grading may more particularly be performed using the above-mentioned conducting foils.

As can be seen in FIG. 2, the main conductor 22 is radially surrounded by a number of conducting foils F1, F2, F3 and F4 of electrically conducting material, which are the above-mentioned foils in the interior of the condenser core. In the bushing 14 there is thus a first innermost foil F1, which surrounds the main conductor 22. A second foil F2 in turn surrounds the first foil F1. Thereafter follows a third foil F3 that surrounds the second foil F2. A fourth foil F4 finally surrounds the third foil F3. It should also be realized that the number of foils shown is merely an example and that more or fewer could be used. However, the electric potential at the interface part IP of the central section CS as well as the fourth foil F4 is typically the second potential P2. The purpose of the foils inside the insulation is thus to grade the electric field from the high potential at the main conductor to the second potential at the periphery of the central section.

The centre of the main conductor 22 may define a longitudinal axis 24 through the bushing 14, i.e. between the first and second ends. The conducting foils may in this case be wound around and coaxial with the main conductor 22. The foils are also spaced from each other in a direction that is perpendicular to the longitudinal axis 24 of the conductor 22. This direction that is perpendicular to the longitudinal axis 24 is in this embodiment a radial direction. Each foil, which as an example may be an aluminum or copper foil, is as an example formed as a hollow cylinder, with each foil having an increased diameter in relation to the previous foil closer to the main conductor 22 in the radial direction. A foil that is closer than a neighboring foil to the main conductor 22 in the radial direction furthermore has a longer extension along the longitudinal axis 24 than this neighboring foil. The diameter and length may be selected so that each foil should cover the same area. Therefore, the lengths of the foils along the longitudinal axis 24 may decrease with the distance, here radial, to this axis. It can thus be seen that the foil length of any outer foil is lower than any inner foil that it surrounds. Put differently, the foil length in the longitudinal direction of any foil on a radial distance from the main conductor 22 is shorter than the foil length of any neighboring foil on a lower radial distance from the conductor.

The central section CS of the bushing may additionally be connected to a flange for mechanical fastening purposes. It is also possible that the open-air end of the insulator body is surrounded by a solid insulator, which may be ceramic or a polymer.

There is also a sensor 30 adjacent the main conductor 22 in the interior of the insulator body and configured to measure a physical property of the high voltage lead-through device. The sensor 30 is placed in an electric field free area of the insulator body 20. The first foil may be electrically connected to the main conductor 22. Therefore, the space between them may be electric field free. The sensor may therefore also be placed inside the first foil F1, which is also a closest neighbouring foil to the main conductor 22. The sensor may additionally be placed between the longitudinal axis 24 passing through the main conductor 22 and the first foil F1. In the realization shown in FIG. 2, the sensor is placed between the main conductor 22 and the first foil F1 The sensor 30 is connected to a communication unit 28 outside of the insulator body 20 on the air side. The connection is made via a first communication medium, which is an electric communication medium, here in the form of an electrical signal conductor 26. The signal conductor 26 stretches in parallel with and separated from the main conductor 22 as well as separated from the first foil F1 from the sensor 30 and through the second end of the bushing 14. The signal conductor 26 is thereby also placed in the field free region along the conductor pipe 22 from the sensor to the communication unit 28. The signal conductor 26 may thereby essentially have the same potential as the main conductor 22. It may thereby essentially have the first electric potential P1 along its whole length.

The communication unit 28 is in turn placed adjacent the main conductor outside of the insulator body. It may as an example be placed at the output terminal to other equipment of the system at the second end of the bushing. It may additionally be placed inside a corona shield. Such a corona shield may be placed around the edges at the second end of the bushing.

As can be seen in FIG. 2, the signal conductor 26 may be placed outside of the main conductor 22, between the main conductor 22 and the closest neighbour foil, i.e. the first foil F1. In this case the first foil F1 may have the same potential as the main conductor 22. The signal conductor 26 stretches along the main conductor 22 outside of the pipe shaped main conductor.

Figure 3:
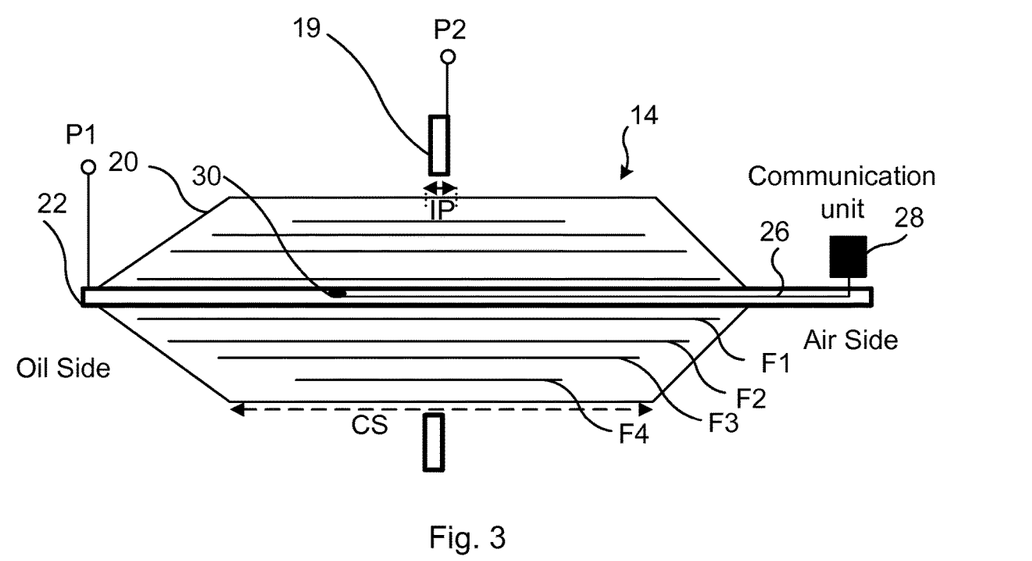

Alternatively, as can be seen in FIG. 3 that shows a second embodiment of the bushing 14, the sensor 30 may be placed inside the pipe shaped main conductor 22. Thereby the sensor 30 and signal conductor 26 may be placed inside the conductor pipe. In both cases it is also possible that the sensor is placed in thermal contact with the pipe. In this case the first foil F1 may have a different potential than the main conductor 22. However, it is also possible that the first foil F1 is connected to the main conductor and has the same potential. The signal conductor 26 also stretches along the main conductor 22 inside the pipe 22. In the latter case the conductor pipe may comprise an opening at the second end out which the connection between the signal conductor 26 and the communication unit 28 is made. As the main conductor 22 is formed as a hollow tube, it can be seen that the interior of the tube where the sensor and the signal conductor is placed is field-free.

In yet another variation, the main conductor is realized as a bar or a litz. In this case the sensor has to be placed between the main conductor and the first foil.

In all the above-described cases the signal conductor 26 leaves the bushing at a location where the electric potential is essentially the same as the potential of the main conductor 22.

This means that potentials of the main conductor, the sensor and the communication unit, i.e. the potentials that these elements have, are essentially the same. The difference between the potentials of the main conductor, sensor and communication unit in operation of the bushing is furthermore less than 50V, with advantage less than to V and preferably less than 5 V. These potential differences may be needed in order for the communication unit to operate the sensor and obtain measurement results therefrom. However, they are so small compared with the potential of main conductor that they are negligible.

Figure 4:
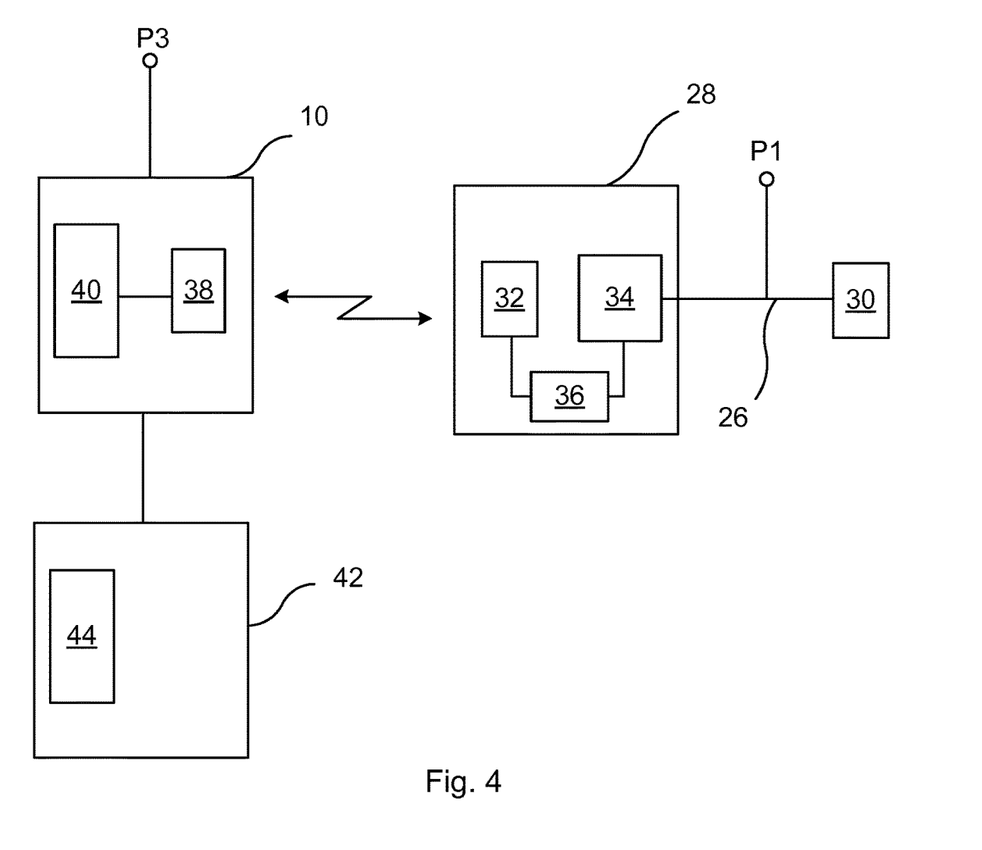

FIG. 4 schematically shows the communication unit 28 together with the data distributing device to and a data handling device 42. As can be seen the communication unit 28 is connected to the sensor 30 via the signal conductor 26. It can also be seen that the communication unit 28 is in wireless contact with the data distributing device to.

The communication unit 28 comprises a physical quantity handling module 34 connected to the sensor 30 via the signal conductor 26 and a wireless transmitting module 32 for wireless communication with the data distributing device 10. There is also a power module 36, supplying electrical power to the wireless transmitting module 32 and the physical quantity handling module 34, which power module may comprise a battery.

In the figure it can also be seen that the signal conductor 26 essentially has the first electric potential P1 and that the data distributing device to has a third electric potential P3. The third potential P3 is, just as the previously described second potential, significantly lower than the first potential P1. The first potential P1 is thus also in this case at least 1 kV higher than the third potential P3. The third potential P3 may be the same as the second potential P2. They may as an example both be ground potentials.

It can also be seen that the data distributing device to comprises a wireless receiving module 38 connected to a data distributing module 40.

There is also a data handling device 42 comprising a data handling module 44.

It can be seen that a second communication medium, which in this case is a wireless communication medium and that is different than the first communication medium, is used between the bushing 14 and the data distributing device to.

It may be of interest to obtain data about physical quantities of the bushing, such as bushing temperature, top oil level, oil gas content, partial discharges and moisture. One reason for doing this is in order to determine the ageing of the bushing, such as to determine ageing of for instance the insulation, predicting when it may fail and determining maintenance intervals.

A bushing is typically used in an electric power system, such as a power transmission or distribution system. In this case it also provides a point in the system where it could be of interest to make measurements. The measurements may in turn be employed in relation to the control of the system.

In order to provide such diagnostics or provide measurements for use in relation to control and protection it may therefore be necessary to measure one or more physical properties of the bushing.

In operation the physical quantity handling module 34 detects sensor signals from the sensor 30. It may for instance apply a voltage to the signal conductor 26 and the sensor 30 for measuring a physical property of the sensor corresponding to the desired physical bushing property. In the case of a temperature sensor the applied voltage may be used to measure the resistance of the sensor, which resistance corresponds to the temperature of the bushing. It can thereby be seen that the sensor is responsive to a voltage applied to the signal conductor 26 and does therefore not need an own power supply.

The measured temperature data may then be handled in the physical quantity handling module 34, which handling may involve converting an analog value to a digital value and signal conditioning, i.e. the adapting of the measured property to standardized signal levels. The physical quantity handling module 34 may additionally comprise other types of functionality such as a timer and a wake-up function used for determining when to make a sensor reading and/or for applying a voltage and transmitting the results. A wakeup function may additionally or instead be provided in the wireless transmitting module 32.

The converted sensor value may then be provided to the wireless transmitting module 32 which may modulate the signal onto one or more suitable wireless carriers for transmission to the wireless receiving module 38 of the data distributing device 10. The carrier may be a wireless short-range carrier, such as a Bluetooth or WiFi carrier and the coding may use a wireless coding technique such as Gaussian Frequency Shift Keying (GFSK). The wireless transmitting module 32 may as an example be a Bluetooth Low Energy (BLE) module. However, alternatives such as Adaptive Network Technology (ANT+) may also be used. The transmitted data is then received by the data distributing device to at the third potential P3. The data is more particularly received by the wireless receiving module 38, which decodes it and then provides the decoded data to the data distributing module 40.

In this way a sensor measurement of a physical property is obtained by the sensor 30 at the high first electric potential P1 and applied electrically to the communication unit 28 at the same high first electric potential P1. From the communication unit 28 data concerning the measured physical property is then wirelessly transmitted to the data handling device to at the low third electric potential P3.

As the sensor and communication unit operate at the same electric potential, the electric field between them is zero. The measured physical property is subjected to the change in electric potential during the wireless transmission. Thereby the sensor does not interfere with the electric field design of the condenser core. Neither does the sensor jeopardize the function of the bushing, which is furthermore achieved without having to rely on an optical medium. This avoiding of the use of an optical medium may be of advantage since it may be technically difficult to include fibre optics in the insulator body, especially if the insulator body comprises a solid insulating medium.

Moreover, through the use of low power levels such as those provided through BLE, it is possible to implement the communication unit 28 as a battery powered standalone unit. Through the placement of the communication unit outside the condenser core on the air side such a battery is furthermore easily accessible, e.g., for being changed for instance at known servicing intervals. The battery may additionally be supplied with power without being regularly replaced, for instance through employing energy harvesting at the bushing. The battery may also be replenished in other ways such as using inductive power transfer. It is also possible that the data distributing unit 40 controls various power saving operations of the communication unit 28, which power saving operations may balance the urgency and need of obtaining measured physical properties with the need to save energy.

It can thus be seen that it is additionally possible to provide an energy self-sufficient high-voltage lead-through device.

The sensor may be any of a number of different types of sensor. It may be a resistive temperature sensor such as the previously mentioned PT100 sensor. However, also other types of sensors are possible. One alternative is a moisture sensor. Another alternative is a Thermocouple. Yet another alternative is a microphone that can be used to detect acoustic noise generated by partial discharges. In this case the physical property being detected is thus an acoustic sound pressure wave generated in the bushing 14. Other possible physical properties that may be measured are the top oil level, which is the level of the oil into which the first end of the bushing 14 is immersed. Thereby the oil-level within the bushing may be measured. In the case of top-oil, it may contain gas. It is also possible that the gas content of this top oil is measured.

In order to use the data with the measured physical quantity, the data may be distributed to devices that need it. The data handling device 42 is one such device that is configured to receive and handle the measured physical quantity.

The physical quantity data obtained by the data distributing device to may therefore be sent to the data handling device 42. The data may in this case be sent wirelessly, or as is shown in FIG. 4, via a wire. Also other types of communication are possible such as optical.

The data handling module 44 of the data handling device 42 may thereby receive the physical property measurements from the bushing 14 and may investigate the detected physical property and determine the ageing of the high-voltage lead-through device based on the measured physical property, such as the ageing of the insulation. The ageing determination may in this case be used for scheduling maintenance, which may with advantage be combined with the previously described battery change. Such analysis may involve analyzing the physical property, such as the temperature of the insulation, the acoustic noise, the moisture, the oil level and/or the oil gas content. The data handling device 42 may thus comprise an ageing determining function implemented in the data handling module 44. Thereby the data handling device 42 and more particularly the data handling module 44 of the data handling device 42 may be configured to determine the ageing of the high-voltage lead-through device based on the detected physical property. This determination may more particularly be made for several high-voltage lead-through devices. A data handling device performing this type of activity may with advantage be placed in the general area of the bushing, such as in a substation in which the bushing is used.

It can be seen that a sensor is introduced inside the insulator body to measure or detect physical properties of the insulator body influenced by the use of the bushing. Physical properties influenced by the operation, such as bushing temperature, top oil level, moisture and acoustic noise, will thus be obtained directly from inside the bushing during operation.

It is in this way possible to measure online the status and health of the bushing. Thereby a continuous monitoring of parameters inside the bushing and communication of data is possible without detrimentally affecting the electrical insulation (design) of the bushing.

The placement of the sensor does not interfere with the electric field design of the condenser core. The sensor does therefore not jeopardize the bushing function. The sensor is reliable and working for the bushing lifetime without need for service. The communication unit is also easily accessible in case of failure of the electronics, battery exchange, or simple exchange of the communication unit due to technology upgrade.

The data handling arrangement may additionally be used during in operation of the power system in which the bushing is provided. The data handling arrangement may as an example use measured temperatures from several high-voltage lead-through devices for determining when and if overload operation of the system can be permitted and for how long such overload operation may be continued. The data handling device 42 may because of this be a part of a process control system controlling an industrial process in which the bushing is used, which control system may be a power grid control system. In this regard it is possible to use the measured temperature to define a dynamic thermal rating such that a higher current in the system can be permitted before protective tripping of the system is triggered or reconfiguration, changes in production and/or emergency shedding of loads is needed. Thus, if the inner temperature is known the ageing state of the bushing can be evaluated and a higher temporary overload rating could be permitted. The data handling device 42 may thus comprise an overload determining function implemented in a data handling module 44 that calculates a dynamic thermal rating which can be used in control and protection of the electric power system. The dynamic thermal rating may more particularly be used to set maximum allowable current levels to be used in the electrical power system.

The proposed solution has a number of further advantages. The communication unit could be passive—, or powered via energy harvesting.

In this way the system would be virtually maintenance free. By using a wireless communication solution, extra insulation requirements between the live part of the bushing and earth are also avoided.

It is also possible to avoid over dimensioning of the bushing. The accuracy of measuring dielectric losses can be improved significantly with better knowledge of the temperature in the bushing.

The data handling module and physical quantity handling module may be implemented using software running on a processor. They may as an alternative be realized through dedicated integrated circuits such as Application-Specific Integrated Circuits (ASICs) or Field-Programmable Gate Arrays (FPGAs).

From the foregoing discussion it is evident that the present invention can be varied in a multitude of ways. The bushing may be a gas-filled bushing instead of a condenser core bushing. The bushing may additionally be a wall bushing. However, the high-voltage lead-through device is not limited to bushings but may be an instrument transformer or a cable termination. In the case of an instrument transformer the section of the insulator body may pass through a coil of the second potential and in the case of a cable termination, it may pass through a ring with the second potential.

Another possible variation is that the sensor data is sent from the communication unit to a hand held unit, e.g. a mobile phone.

It is also possible to use the sensor data in simulations. A physical model may be made of the high-voltage lead-through device with input from the temperature sensor and information about ambient condition. This model may then allow the simulation of the temperature distribution inside the insulator body.

It shall consequently be realized that the present invention is only to be limited by the following claims.

The invention claimed is:

1. A high voltage lead-through device comprising:
an insulator body having a solid exterior and including insulation,
a main conductor passing through the insulator body surrounded by insulation, wherein the insulator body comprises a number of conducting foils around the main conductor, where a closest neighbouring foil is electrically connected to the main conductor, wherein in operation of the high-voltage lead-through device the main conductor is configured to have a first electric potential and at least a part of one section of the solid exterior of the insulator body is configured to face a second electric potential by passing through a plane, a ring or a coil having the second potential,
a sensor adjacent the main conductor in the interior of the insulator body inside the closest neighbouring foil and configured to measure a physical property of the high voltage lead-through device, and
a communication unit adjacent the main conductor outside of the insulator body and being connected to the sensor using a first communication medium,
wherein said communication unit comprises a communication module employing a second, different communication medium for communicating data concerning the measured physical property to a data distribution device at a third electric potential, and the first communication medium is an electrical communication medium in the form of a signal conductor separated from and stretching along at least a part of the main conductor.

2. The high-voltage lead-through device according to claim 1, wherein said communication unit, sensor and main conductor have potentials that differ from each other by less than 50 V.

3. The high-voltage lead-through device according to claim 1, wherein the first electric potential is at least 1 kV above both the second and the third electric potentials.

4. The high-voltage lead-through device according to claim 1, wherein the physical properties are obtained at the electric potentials used in operation of the high-voltage lead-through device.

5. The high-voltage lead-through device according to claim 1, wherein the main conductor is a conductor pipe.

6. The high-voltage lead-through device according to claim 5, wherein the sensor is placed inside the conductor pipe.

7. The high-voltage lead-through device according to claim 1, wherein the sensor is placed between the main conductor and the closest neighbouring foil.

8. The high-voltage lead-through device according to claim 1, wherein the second communication medium is a wireless communication medium and the communication module is a wireless communication module.

9. The high-voltage lead-through device according to claim 8, wherein the wireless communication medium is a wireless short-range communication medium.

10. The high-voltage lead-through device according to claim 8, wherein the communication unit is a low power communication unit.

11. The high-voltage lead-through device according to claim 1, wherein the sensor is a temperature sensor or a microphone.

12. The high-voltage lead-through device according to claim 1, wherein the high voltage lead-through device is one of a wall bushing, a transformer bushing, a cable termination and an instrument transformer.

13. An arrangement for handling data of a high-voltage lead-through device that is a part of an electric power system, the arrangement comprising a data distributing device, a data handling device and the high-voltage lead-through device according to claim 1, wherein the data handling device is configured to receive and handle the measured physical quantity.

14. The arrangement according to claim 13, wherein the physical quantity comprises a temperature of the high-voltage lead-through device and the data handling device when handling the temperature is configured to calculate a dynamic thermal rating which can be used in control and protection of the electric power system.

15. The arrangement according to claim 13, wherein the data handling device is configured to determine the ageing of the electric high voltage device based on the detected physical property.

* * * * *